United States Patent [19]
Houska et al.

[11] 4,149,064
[45] Apr. 10, 1979

[54] METHOD AND APPARATUS FOR ADJUSTING ELECTRICAL NETWORKS CONSISTING OF SYNTHETIC FOILS

[75] Inventors: Karl H. Houska; Eberhard Wernitz, both of Munich, Fed. Rep. of Germany

[73] Assignee: Siemens Aktiengesellschaft, Berlin & Munich, Fed. Rep. of Germany

[21] Appl. No.: 797,338

[22] Filed: May 16, 1977

[30] Foreign Application Priority Data
May 19, 1976 [DE] Fed. Rep. of Germany ....... 2622324

[51] Int. Cl.$^2$ ................................................ B23K 9/00
[52] U.S. Cl. ............................... 219/121 LM; 29/620
[58] Field of Search ................... 338/198; 29/593, 620, 29/625; 219/121 EM, 121 LM

[56] References Cited
U.S. PATENT DOCUMENTS

| | | | |
|---|---|---|---|
| 3,453,097 | 7/1969 | Hafner | 219/121 LM |
| 3,768,157 | 10/1973 | Buie | 219/121 LM |
| 3,827,142 | 8/1974 | Bennett | 219/121 LM |
| 3,913,224 | 10/1975 | Preissinger et al. | 29/625 |
| 4,065,656 | 12/1977 | Brown et al. | 219/121 LM |

Primary Examiner—J. V. Truhe
Assistant Examiner—Fred E. Bell
Attorney, Agent, or Firm—Hill, Gross, Simpson, Van Santen, Steadman, Chiara & Simpson

[57] ABSTRACT

A method and apparatus for adjusting an electrical characteristic of an electrical component of an electrical network which network comprises a stack of secured together foils or layers which include one or more synthetic foils each having a metal layer on one or both surfaces and a cover foil and has connecting wires which are fused through the cover foil and welded to the desired spots on a metal layer characterized by trimming at least one of the metal layers to obtain the desired electrical characteristic by directing a laser beam through at least one foil and focusing the beam on the metal layer being trimmed. To prevent inadvertent and undesired trimming of a metal layer while trimming a given metal layer, one of the synthetic carrier foils may be of a material which is impervious to the laser beam or may be provided with a reflective metal layer. To practice the invention, the laser beam is focused and deflected by an apparatus which is controlled by a program device which adjusts the rate of deflection in response to the desired geometry and theoretical values for the electrical characteristic and the electrical characteristic of the layer being trimmed is measured by a measuring bridge which will emit a signal when the desired characteristic is obtained to stop the operation of the laser beam.

7 Claims, 1 Drawing Figure

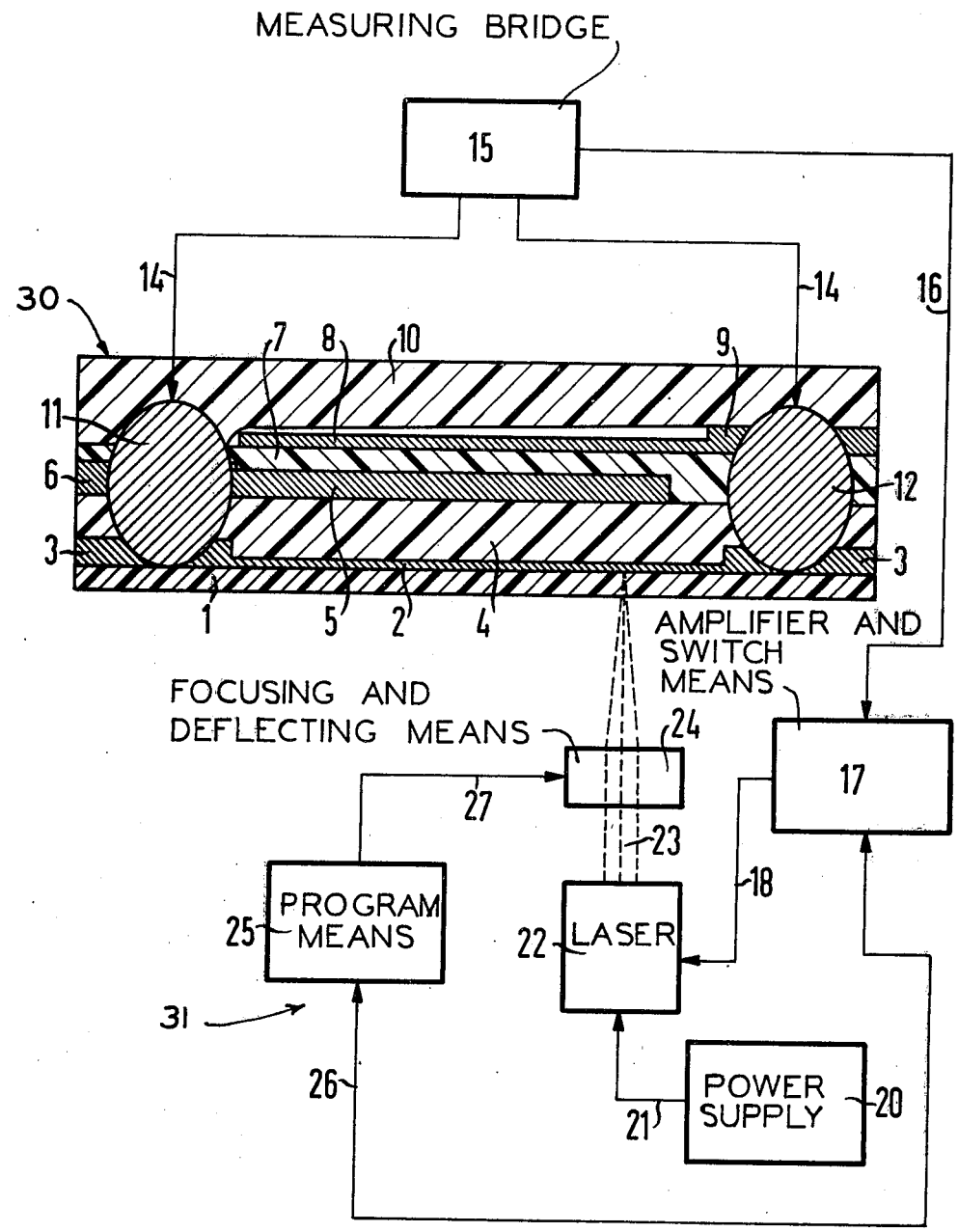

METHOD AND APPARATUS FOR ADJUSTING ELECTRICAL NETWORKS CONSISTING OF SYNTHETIC FOILS

BACKGROUND OF THE INVENTION

1. Field of the Invention

The present invention is directed to a process and apparatus for adjusting an electrical characteristic of a component of an electrical network, which consists of a stack of layers or foils, which are secured together and include at least one synthetic carrier foil with a metal layer and a thermoplastic cover foil, and has connecting wires which are fused through the outer cover foil are welded to the desired portions or spots of a metal layer.

2. Prior Art

Electrical networks having one or more electrical components are disclosed in U.S. Pat. No. 3,913,224 which is based on German Offenlegungsschrift No. 22 47 279. As disclosed in this patent, the network is composed of a plurality of synthetic foils or layers which are arranged in the stack and secured together. The stack has one or more synthetic carrier foils which are provided with a metal layer on either one or both sides and a cover foil of thermoplastic material. To form a connection with the components formed in the stack, a connecting wire is fused through the cover foil and any inner foils until it contacts and is welded to a desired portion of a metal layer of a component. A network of this type can be favorably produced in large numbers in an economical fashion. The stack may be formed of a plurality of different networks, which are subsequently divided up into the individual networks if desired.

In accordance with the present practice, an electrical component particularly a resistor, which has been applied to one of the synthetic foils in the form of a thin layer, is adjusted or trimmed to the desired theoretical value before the individual foils are assembled into the stack to form the network. During the following processing steps, changes may occur in the electrical characteristics of the component and these changes necessitate a final checking of the completed network. Due to changes occurring in the electrical characteristics of the component during formation of the network, the electrical characteristics may fall outside of the permitted tolerance. Since an adjustment of the characteristics of the components is not possible after forming the network, those networks having characteristics outside of the tolerance range must be scrapped or rejected.

SUMMARY OF THE INVENTION

The present invention is directed to a method of adjusting the electrical characteristics of an electrical component of an electrical network which adjustment is carried out after the completion of the assembly of the network.

To accomplish these tasks, the method for adjusting the electrical characteristics of the electrical component of the network provides a network having a stack of foils secured together, said stack having at least one synthetic foil with a metal layer and a thermoplastic cover foil, said network having connecting wires which are fused through the cover foil and are welded in contact with a desired portion of the metal layer, the adjusting is accomplished by trimming the metal layer of the component of the network by directing the laser beam through at least one of the foils and focusing it onto the metal layer. Preferably, the trimming is monitored and controlled by measuring the electrical characteristic of the component being trimmed.

The method of adjusting the electrical characteristics of a component of a network after the network has been assembled provides the advantage that all changes in the values of the electrical characteristics which occurred during the production of the network, which is composed of a stack of foils, can be taken into consideration during the trimming step. In addition, the previous measuring step to check the electrical characteristics after completion of the network can be eliminated since the adjusting process simultaneously includes a final checking of the electrical characteristics of the particular component of the network. Since the adjustment of the electrical characteristics to the desired value are obtained after completion of the assembly of the stack forming the network, the obtainable tolerance accuracy is increased and thus reduces the number of networks which must be rejected for failing to meet this tolerance requirement.

Preferably, transparent synthetic foils are used as the carrier foils for the metal layers forming the resistance layers, the capacitor coating layers and the contact layers. A good transparency of the foils is necessary in particular in the case of a relatively thick thermoplastic cover foil which has a thickness of approximately 200 $\mu$m and which is conventionally used in the film circuit networks of this type. The thermoplastic and non-thermoplastic foils, which are used as carrier foils for the various metal layers, are generally sufficiently transparent on account of their small thickness, which is approximately 50 $\mu$m, and smooth surfaces. For this reason, it is possible to simultaneously process a plurality of metallized substrate foils which are stacked one upon the other.

By using a synthetic carrier foil of a material which is impervious to the laser light either by a light diffusing characteristic or a light absorbing characteristic or by using a carrier foil provided with a reflective metal layer inside the network, it is possible to prevent a further penetration of the laser beam and thus the treatment of the metal layer which lies behind this foil. It is not required that the reflective metal layer be specifically added to the network in view of the fact that a metal layer for a capacitor electrode is generally produced from aluminum and can be used as this reflective metal layer.

The apparatus or device for practicing the method of adjusting is characterized by a laser with an associated power supply unit, means serving to deflect the laser beam and to focus the laser beam on the desired metal layer, a measuring bridge, a program device or means which stores the adjustment geometry and theoretical values of the component and controls the operation of the deflecting means, amplifier and switching device or means which will receive a signal from the measuring bridge when the component's theoretical value is reached and switches off the laser and starts or initiates the next adjustment or trimming step. The laser beam is focused in a known manner through lenses and the deflection is carried out, for example, with moving reflectors which are controlled by the program means.

BRIEF DESCRIPTION OF THE DRAWING

The FIGURE illustrates a schematic presentation of the apparatus for adjusting electrical characteristics of a component of a network, which is shown in cross section, in accordance with the present invention.

DESCRIPTION OF THE PREFERRED EMBODIMENT

The principles of the present invention are particularly useful in adjusting electrical characteristics of a component in a film circuit network generally indicated at 30 in the FIGURE.

The film circuit network 30 comprises a stack of synthetic carrier foils 1, 4 and 7 and a thermoplastic cover foil or layer 10. As illustrated, the synthetic foil 1 is provided with a resistance layer 2, which is a metal layer having zones or areas 3 of increased thickness to provide contacting surface zones. The synthetic layer 4 is provided with a metal layer 5, which forms a capacitor coating and has a portion or zone 6 of increased thickness to form a contact surface zone, and the synthetic foil 7 is provided with a metal layer 8, which forms another capacitor coating and has a zone 9 of increased thickness to form a surface contact zone. The carrier foils 1, 4, 7 and their associated metal layers along with the cover foil 10 are arranged in a stack and secured together by appropriate means such as glue or by an application of heat and pressure so that each of the metal layers 2, 5 and 8 are sandwiched beween a pair of foils as illustrated. As illustrated, the network 30 has a capacitor formed by metal layers 5 and 8 and a resistor formed by the layer 2.

To form electrical contacts with the two components, connecting wires 11 and 12 are pressed through the cover foil 10 to be fused into the stack and to form welded contact with the various contact zones of the metal layers. As illustrated, the wire 11 is welded to contact zones 6 of the layer 5 of the capacitor and one of the contact areas 3 for the resistor. In a similar manner, the connecting wire 12 is contact welded with both the other contact zone 3 of the resistor and the zone 9 of the capacitor.

In order to adjust the electrical characteristics of one of the components such as the resistor formed of the metal layer or resistor layer 2, after assembly of the network 30, an apparatus generally indicated at 31 is utilized. The apparatus 31 includes a laser 22, which is fed by a line 21 from an associated supply device or power supply 20. A particularly suited laser is a YAG laser, which will have a laser beam 23 of a short-wavelength that will penetrate the transparent foils very easily. The laser beam 23 after emerging from the laser 22 is directed through the synthetic foil 1 and focused on the resistance layer 2 with the aid of a device or means 24, which includes lenses for focusing the beam 23 and includes means for deflecting the beam along a given path in accordance with the desired geometry or configuration of the resistor. The desired geometry or configuration of the resistor is stored in a program means 25, which controls the operation of the deflecting means in the device 24 via a line 27.

A resistance measuring bridge 15 is connected by two electrodes 14 to the connecting wires 11 and 12 and thus is in electrical contact between the two contact surfaces 3 of the resistor layer 2 which is being machined or trimmed. When a theoretical value for the resistor is reached, the resistance measuring bridge 15 will produce a signal on line 16 which extends to means 17, which includes an amplifier and switching device which is also influenced by inputs on line 26 from the program means 25. When the theoretical value of the component currently being machined or trimmed is reached, the means 17 switches off the laser 22 by sending a signal on a line 18. In addition, the device 17 will send a signal or pulse on line 26 to the program means 25 to initiate the next adjustment step. Each of the various devices 15, 17, 20, 22, 24 and 25 are commercially available units or devices.

In the illustrated example, penetration of the laser beam 23 through the metal layer 2 to the capacitor layer electrode 5 is prevented by using a synthetic carrier foil 4 which is impermeable to light. This impermeability may be due to a light absorption characteristic or a light diffusion characteristic of the material forming the foil 4. If it is desired to also adjust the electrical characteristics of the capacitor, which is formed by the layers 5 and 8, the entire network 30 can be rotated relative to the apparatus 31 so that the laser beam 23 can be projected through the transparent cover foil 10 and be focused on the metal layer 8 forming a capacitor layer. To prevent penetration of the laser beam beyond a desired depth, the lower capacitor layer formed by the coating 5 can serve, for example, as a reflective layer. Since layer 5 is to act as a reflecting coating, it is thicker than the other layers.

It should be pointed out that with the method and apparatus in accordance with the present invention, it is possible to carry out not only fine adjustments in the electrical characteristics of components such as resistors and capacitors by trimming or machining, but to also perform extended processing or machining procedures. For example, the laser beam 23 can be utilized to provide or machine a meandering or serpentine-shaped resistor in the metal layer 2. In addition, the trimming or machining by the laser beam 23 can be controlled to be accomplished without any material being evaporated to cause disturbances in the network function, for example a short circuit, even though the whole area of the processed metal layer is not glued or secured to the surrounding synthetic foils.

The network 30 was constructed of the following materials. The carrier foils 1 and 7 were PI, PETP and had a thickness of 25 $\mu$m–50 $\mu$m. The light impermeable foil 4 was PETP and had a thickness of 25 $\mu$m–50 $\mu$m. The cover foil 10 was PETP with a thickness of 190 $\mu$m. Resistor layer 2 is Ni-Cr with a thickness of 200 Å, and capacitor layers 5 and 8 are aluminium with thickness of 3000 Å and 700 Å, respectively.

Although various minor modifications might be suggested by those versed in the art, it should be understood that we wish to embody within the scope of the patent warranted hereon, all such modifications as reasonably and properly come within the scope of our contribution to the art.

We claim:

1. A method for adjusting an electrical characteristic of an electrical component of an electrical network having a stack of foils secured together, said stack having at least one synthetic carrier foil with a metal layer and an outer thermoplastic cover foil engaging one of the metal layers so that each metal layer of the stack is sandwiched between a pair of foils, said network having connecting wires which are fused through the outer cover foil and welded in contact with desired portions of the metal layers, said method comprising providing said electrical network, and trimming a metal layer of a component of the network by directing a laser beam through at least one of said foils and focusing it onto the metal layer.

2. A method according to claim 1, wherein the network has at least two synthetic carrier foils, each of said foils being provided with at least one metal layer and one of said synthetic carrier foils separating two metal layers, said one synthetic carrier foil being of a material impervious to the wavelength of the laser beam so that the laser beam will not penetrate through said one carrier foil as one of the metal layers is being trimmed.

3. A method according to claim 1, wherein the network has at least two synthetic carrier foils, said synthetic carrier foils each being of a material which is transparent to the laser beam.

4. A method according to claim 3, wherein one of the transparent synthetic carrier foils is provided with a reflective metal layer so that during the trimming operation, said laser beam is reflected by the reflective metal layer.

5. A method for adjusting an electrical characteristic of an electrical component of an electrical network by using a laser beam, said network having a stack of foils secured together, said stack having at least two synthetic carrier foils with a metal layer and an outer thermoplastic cover foil, said synthetic carrier foils each being of a material which is transparent to the laser beam, the metal layer on one of the transparent synthetic carrier foils being a reflective metal layer so that during a trimming operation, said laser beam is reflected by the reflective metal layer, said network having connecting wires which are fused through the outer cover foil and welded in contact with desired portions of the metal layers, said method comprising providing said electrical network, and trimming a metal layer of a component of the network adjacent one of the outer foils by directing a laser beam through at least one of said outer foils and focusing it onto the metal layer, after trimming the metal layer adjacent said one outer foil, performing a second trimming operation on a metal layer adjacent the other outer foil by rotating the network, and directing the focused laser beam through the other outer foil.

6. A method according to claim 1, which includes measuring the electrical characteristic of the layer being trimmed and controlling the trimming operation in response to the measured characteristics.

7. An apparatus for adjusting an electrical characteristic of an electrical component of an electrical network, which network comprises at least one synthetic carrier foil with a metal layer and a thermoplastic cover foil secured together in a stack with each metal layer being sandwiched between a pair of foils, said network has connecting wires fused through the cover foil and welded in contact in the desired portion of a metal layer, said apparatus comprising a laser having an associated power supply and producing a laser beam; means for foscusing the laser beam through at least one foil and on a metal layer to be trimmed and for deflecting the focused beam along a given path; a measuring bridge for measuring characteristics of the metal layer being trimmed; program means for storing the adjustment geometry and theoretical values of the electrical characteristics of the component, said program means controlling the means for deflecting; and amplifying and switching means for receiving a signal from the measuring bridge and for terminating operation of the laser and iniating the next adjustment step when the desired theoretical value is obtained.

* * * * *